United States Patent
Xu et al.

(10) Patent No.: US 10,734,592 B2
(45) Date of Patent: Aug. 4, 2020

(54) METHOD FOR MANUFACTURING THERMAL INSULATION FILM, THERMAL INSULATION STRUCTURE, AND DISPLAY DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Xufei Xu, Beijing (CN); Na Zhao, Beijing (CN); Yijun Wang, Beijing (CN); Qiyu Shen, Beijing (CN)

(73) Assignees: HEFEI BOE OPTOELECTRONICS TECHNOLOGY CO., LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/243,653

(22) Filed: Jan. 9, 2019

(65) Prior Publication Data

US 2019/0363268 A1    Nov. 28, 2019

(30) Foreign Application Priority Data

May 28, 2018 (CN) .......................... 2018 1 0523684

(51) Int. Cl.
*H01L 51/00* (2006.01)
*G06F 3/041* (2006.01)
(Continued)

(52) U.S. Cl.
CPC ........ *H01L 51/0097* (2013.01); *G06F 3/0412* (2013.01); *G06F 3/044* (2013.01);
(Continued)

(58) Field of Classification Search
None
See application file for complete search history.

(56) References Cited

U.S. PATENT DOCUMENTS

| 2011/0193103 A1 | 8/2011 | Sato et al. |
| 2013/0233086 A1* | 9/2013 | Besling ................. G01L 9/0072 73/724 |

(Continued)

FOREIGN PATENT DOCUMENTS

| CN | 102194764 B | 9/2011 |
| CN | 104114745 A | 10/2014 |

(Continued)

OTHER PUBLICATIONS

Definition of coincide downloaded from URLhttps://www.merriam-webster.com/dictionary/coincide> on Feb. 11, 2020. (Year: 2020).*

(Continued)

*Primary Examiner* — J. E. Schoenholtz
(74) *Attorney, Agent, or Firm* — Brooks Kushman P.C.

(57) ABSTRACT

The present disclosure provides a method for manufacturing a thermal insulation film, a thermal insulation structure, and a display device. The method for manufacturing the thermal insulation film includes: providing a substrate; forming a sacrificial layer on the substrate; forming a thermal insulation layer on the sacrificial layer, the thermal insulation layer including at least one opening capable of exposing a portion of the sacrificial layer; and etching the sacrificial layer through the opening, so as to form a plurality of hollow holes between the thermal insulation layer and the substrate. A method for manufacturing the thermal insulation film according to the present disclosure is used for manufacturing a thermal insulation film.

18 Claims, 4 Drawing Sheets

(51) Int. Cl.
  *G06F 3/044*   (2006.01)
  *H01L 27/32*   (2006.01)

(52) U.S. Cl.
  CPC .. *G06F 2203/04103* (2013.01); *H01L 27/323* (2013.01); *H01L 27/3244* (2013.01)

(56)  References Cited

U.S. PATENT DOCUMENTS

| | | |
|---|---|---|
| 2014/0376191 A1 | 12/2014 | Hwang |
| 2015/0331150 A1 | 11/2015 | Furholz et al. |

FOREIGN PATENT DOCUMENTS

| | | |
|---|---|---|
| CN | 104737634 B | 6/2015 |
| CN | 105873249 A | 8/2016 |
| CN | 105957805 A | 9/2016 |
| CN | 107611140 A | 1/2018 |
| TW | 201406838 A | 2/2014 |

OTHER PUBLICATIONS

CN102194764B, English Abstract of corresponding publication CN102194764A and U.S. Equivalent U.S. Pub. No. 2011/0193103.
CN104114745A, English Abstract and U.S. Equivalent U.S. Pub. No. 2015/0331150.
CN104737634B, English Abstract of corresponding publication CN104737634A and U.S. Equivalent U.S. Pub. No. 2014/0376191.
TW201406838A, English Abstract and Machine Translation.
First Office Action for Chinese Application No. 201810523684.1, dated Mar. 24, 2020, 6 Pages.

\* cited by examiner

METHOD FOR MANUFACTURING THERMAL INSULATION FILM, THERMAL INSULATION STRUCTURE, AND DISPLAY DEVICE

CROSS-REFERENCE TO RELATED APPLICATION

This application claims priority to Chinese Patent Application No. 201810523684.1 filed on May 28, 2018, which is incorporated herein by reference in its entirety.

TECHNICAL FIELD

The present disclosure relates to the field of display technology, in particular to a method for manufacturing a thermal insulation film, a thermal insulation structure, and a display device.

BACKGROUND

At present, a method of manufacturing a display device generally includes the steps of forming a display element on a substrate, and packaging the display element, etc. However, since a high-temperature process is used in forming the display element on the substrate, the above high-temperature process may damage the substrate and affect the yield rate in the manufacture of the display device, if the substrate used in the manufacture of the display device is made of a material that is not resistant to high temperature.

SUMMARY

A first aspect of the present disclosure provides a method for manufacturing a thermal insulation film, including:

providing a substrate;

forming a sacrificial layer on the substrate;

forming a thermal insulation layer on the sacrificial layer, the thermal insulation layer including at least one opening capable of exposing a portion of the sacrificial layer; and etching the sacrificial layer through the opening, so as to form a plurality of hollow holes between the thermal insulation layer and the substrate.

Optionally, an orthogonal projection of the thermal insulation layer on the substrate is located within an orthogonal projection of the sacrificial layer on the substrate.

Optionally, the orthogonal projection of the thermal insulation layer on the substrate is located within the orthogonal projection of the sacrificial layer on the substrate, such that an orthogonal projection of an outer boundary of the sacrificial layer on the substrate is capable of enclosing the orthogonal projection of the thermal insulation layer on the substrate.

Optionally, an orthogonal projection of the sacrificial layer on the substrate coincides with an orthogonal projection of the plurality of hollow holes on the substrate.

Optionally, the forming the sacrificial layer on the substrate includes:

depositing a sacrificial material on the substrate; and patterning the sacrificial material to obtain the sacrificial layer having a mesh structure formed by crossing a plurality of branch lines extending along a first direction and a plurality of branch lines extending along a second direction.

Optionally, the plurality of branch lines extending in the first direction and the plurality of branch lines extending in the second direction are periodically arranged.

Optionally, in the sacrificial layer, a distance between any adjacent two laterally extending branch lines is at a submicron scale, and a distance between any adjacent two longitudinally extending branch lines is at a sub-micron scale; or in the sacrificial layer, a width of each branch line in a direction perpendicular to an extending direction thereof is at a sub-micron scale.

Optionally, the sacrificial layer is made of one or more of aluminum, molybdenum, copper, indium tin oxide, and indium gallium tin oxide.

The etching the sacrificial layer through the opening includes:

etching the sacrificial layer through the opening by a wet etching process.

Optionally, the forming the thermal insulation layer on the sacrificial layer includes: forming a thermal insulation film covering the sacrificial layer with a thermal insulation material, and then patterning the thermal insulation film to form the thermal insulation layer including at least one opening.

Optionally, the thermal insulation layer is made of: one or more of an oxygen-containing compound, a carbon-containing compound, an oxygen- and carbon-containing compound, a nitrogen-containing compound, an oxygen- and nitrogen-containing compound, a boron-containing compound, an oxygen- and boron-containing compound, a fluorine-containing compound, an oxygen- and fluorine-containing compound, a silicon-containing compound, a silicon- and oxygen-containing compound and acrylic.

Optionally, the thermal insulation layer is made of: one or more of silicon oxide, silicon nitride, silicon oxynitride and a photosensitive resin.

Optionally, the openings of the thermal insulation layer are periodically distributed.

Based on the technical solution of the above method for manufacturing the thermal insulation film, a second aspect of the present disclosure provides a thermal insulation structure, including at least one thermal insulation film laminated on a substrate, wherein the thermal insulation film comprises a thermal insulation layer and a plurality of hollow holes between the thermal insulation layer and the substrate, and the thermal insulation layer comprises at least one opening.

Optionally, the substrate is formed with at least two thermal insulation films, in which an orthogonal projection of an opening in one of two adjacent thermal insulation films on the substrate does not coincide with an orthogonal projection of an opening in the other one of the two adjacent thermal insulation films on the substrate.

Optionally, the substrate is formed with at least two thermal insulation films, in which an orthogonal projection of a hollow hole in one of two adjacent thermal insulation films on the substrate does not coincide with an orthogonal projection of a hollow hole in the other one of the two adjacent thermal insulation films on the substrate.

Based on the technical solution of the above thermal insulation structure, a third aspect of the present disclosure provides a display device, including: a display element formed on a substrate, and the above thermal insulation structure arranged between the substrate and the display element.

Optionally, the display device further includes: an overcoat arranged between the display element and the thermal insulation structure.

Optionally, the display device further includes: a touch electrode layer arranged between the substrate and the thermal insulation structure.

Optionally, the display device further includes: an etch stopping layer arranged between the touch electrode layer and the thermal insulation structure.

BRIEF DESCRIPTION OF THE DRAWINGS

The drawings described herein are intended to provide a further understanding of the present disclosure, and constitute a part of this disclosure. The illustrative embodiments of the present disclosure and the description thereof are intended to illustrate the present disclosure, and do not constitute an improper limitation of the present disclosure. In the drawings.

DETAILED DESCRIPTION

In order to further illustrate the method for manufacturing the thermal insulation film, the thermal insulation structure, and the display device provided by the embodiments of the present disclosure, the present disclosure will be described in detail hereinafter in conjunction with the drawings.

Based on the problems described in the background, the inventor of the present disclosure conducted the following studies:

When the dielectric layer is a composite dielectric layer including the first dielectric layer to the Nth dielectric layer, the equivalent characteristic parameter of the composite dielectric layer satisfies the following equation: $d/x = \Sigma(d_i/x_i)$, where d represents the total thickness of the composite dielectric layer, x represents the total effective characteristic parameter of the composite dielectric layer, di represents the thickness corresponding to the i-th dielectric layer included in the composite dielectric layer, and xi represents the characteristic parameter corresponding to the i-th dielectric layer included in the composite dielectric layer, the value of i ranges from 1 to N, and both i and N are positive integers.

Since air is considered to be an excellent thermal insulation material with a low thermal conductivity (typically 0.026 W/(m·K) of thermal conductivity), it is conceivable to provide a composite dielectric layer including an air layer. Taking the composite dielectric layer including the first air layer and the second dielectric layer as an example, according to the above equation, the equivalent relative dielectric constant k and the equivalent thermal conductivity λ of the composite dielectric layer may be obtained as follows:

$$k = 1/[(d1/d)/k1 + (d2/d)/k2]$$

$$\lambda = 1/[(d1/d)/\lambda1 + (d2/d)/\lambda2]$$

where d1 represents the thickness of the first air layer, d2 represents the thickness of the second dielectric layer, d represents the total thickness of the composite dielectric layer, k1 represents the relative dielectric constant of the first air layer, k2 represents the relative dielectric constant of the second dielectric layer, k represents the total effective relative dielectric constant of the composite dielectric layer, λ1 represents the thermal conductivity of the first air layer, λ2 represents the thermal conductivity of the second dielectric layer, and λ represents the total thermal conductivity of the composite dielectric layer.

When the thickness of the first air layer is ⅓ of the total thickness of the composite dielectric layer, and the thickness of the second dielectric layer is ⅔ of the total thickness of the composite dielectric layer, that is, d1/d=⅓ and d2/d=⅔, the first air layer corresponds to λ1=0.026 W/(m·K) and k1=1.0, the second dielectric layer corresponds to λ2=16.7 W/(m·K) and k2=6.4 (both λ2 and k2 are typical values), it may be calculated: k/k2=2.28/6.4=35.6% and λ/λ2=0.078/16.7=0.46%, that is, after the introduction of the air layer, the dielectric constant and thermal conductivity of the composite dielectric layer is reduced by 64.4% and 99.54%, respectively, relative to the case that there is the second dielectric layer alone. In view of this, the introduction of an air layer into the composite dielectric layer will significantly improve the electrical and thermal properties of the dielectric layer.

Also given that the air layer may not be directly formed by using air as a thermal insulation material due to air convection or other factors, the inventor of the present disclosure further found that a porous film may be prepared to form a plurality of meshed fine air gaps. Thus, the air in each air gap cannot be convected, so that the air may be locked (enclosed) in the fine air gaps to form an air layer having an excellent thermal insulation property that meets the needs.

Figure 1:
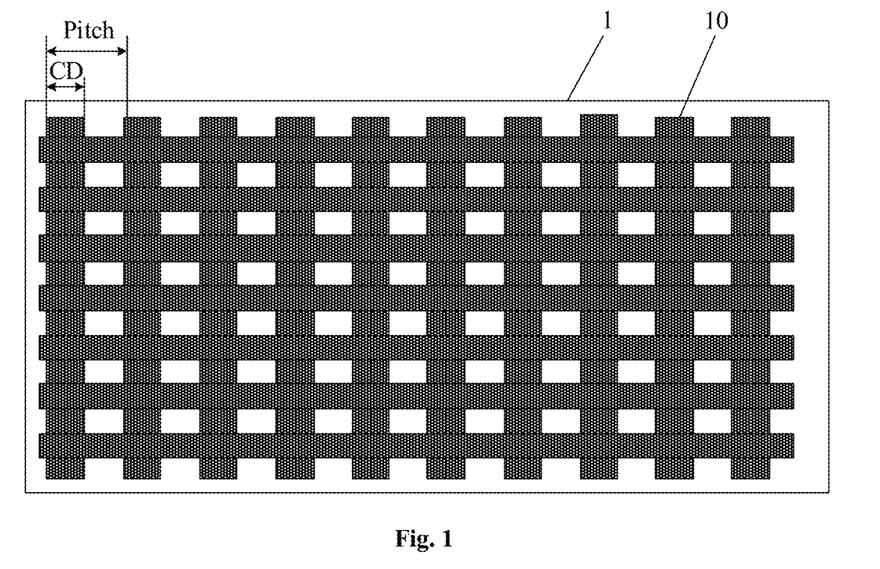
FIG. 1 is a schematic diagram of manufacturing a sacrificial layer on a substrate according to an embodiment of the present disclosure.
Figure 2:
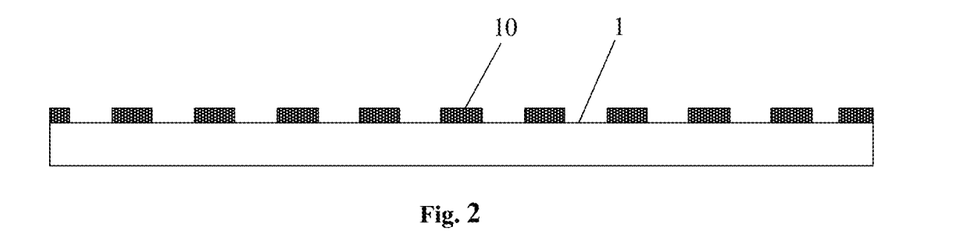
FIG. 2 is a cross-sectional view of manufacturing a sacrificial layer on a substrate according to an embodiment of the present disclosure.
Figure 3:
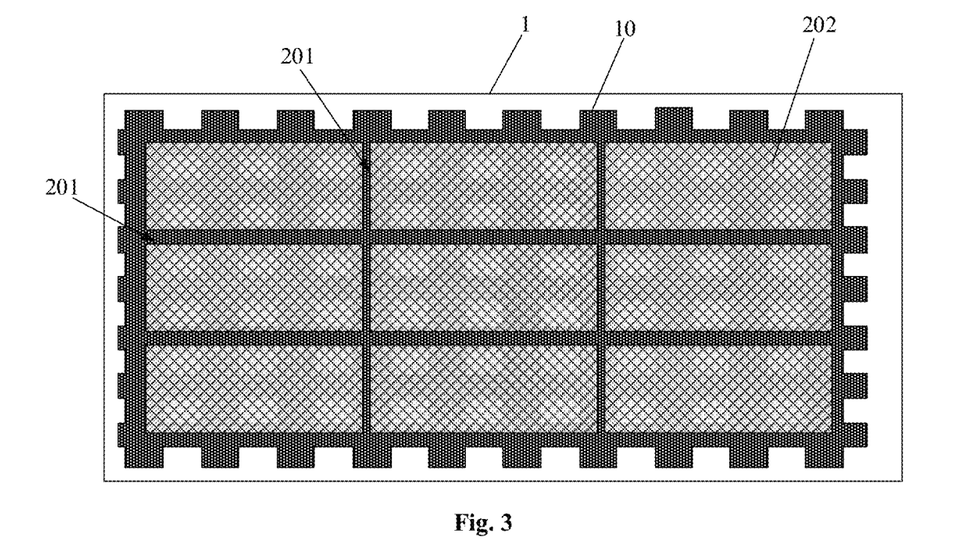
FIG. 3 is a schematic diagram of manufacturing a thermal insulation layer on a sacrificial layer according to an embodiment of the present disclosure.
Figure 4:
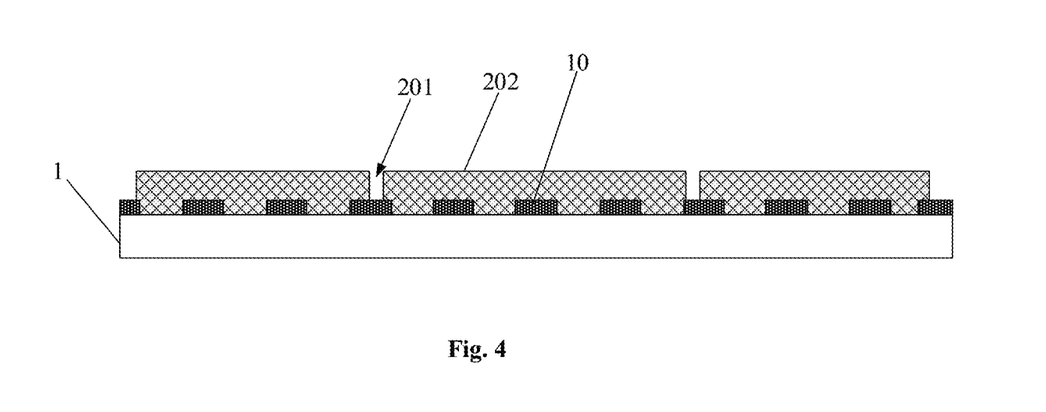
FIG. 4 is a cross-sectional view of manufacturing a thermal insulation layer on a sacrificial layer according to an embodiment of the present disclosure.
Figure 5:
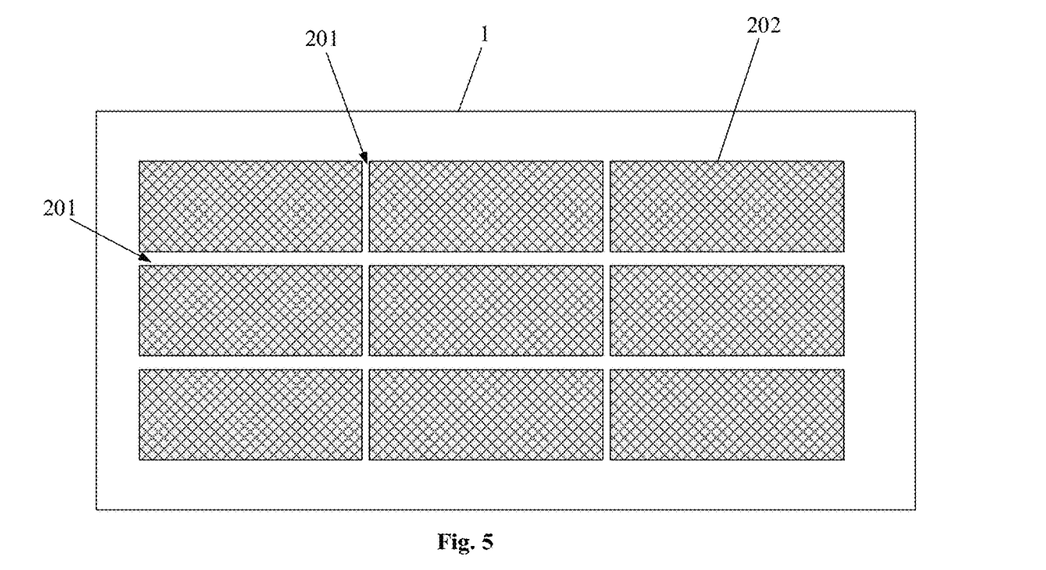
FIG. 5 is a schematic diagram of a thermal insulation film according to an embodiment of the present disclosure.
Figure 6:
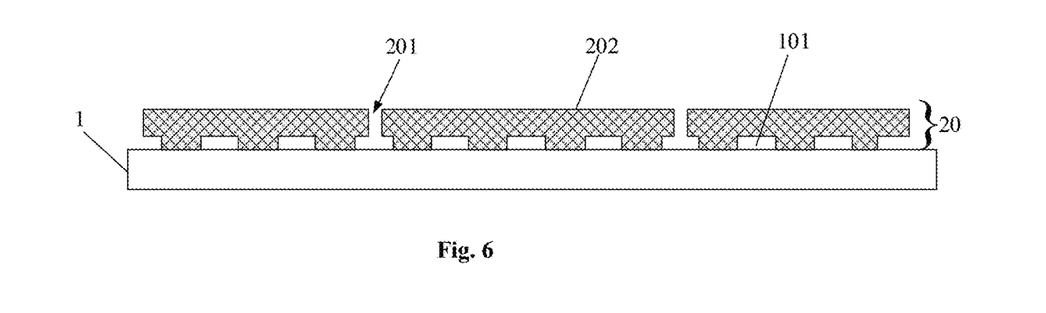
FIG. 6 is a cross-sectional view of a thermal insulation film according to an embodiment of the present disclosure.

Based on the above research, the embodiment of the present disclosure provides a method for manufacturing a thermal insulation film, as shown in FIG. 1 to FIG. 6, the method includes the following steps:

step 101, providing a substrate 1;

step 102, forming a sacrificial layer 10 on the substrate 1, as shown in FIG. 1 and FIG. 2;

step 103, forming a thermal insulation layer 202 on the sacrificial layer 10, the thermal insulation layer 202 including at least one opening 201 capable of exposing a portion of the sacrificial layer 10, as shown in FIG. 3 and FIG. 4; and step 104, etching the sacrificial layer 10 through the opening 201, so as to form a plurality of hollow holes 101 between the thermal insulation layer 202 and the substrate 1, as shown in FIG. 5 and FIG. 6.

The types of the above substrates are various, and may be selected according to actual needs. Exemplarily, when the thermal insulation film to be manufactured is applied in a flexible display element, a plastic baseplate may be selected as the substrate, for example, PC (polycarbonate), PET (polyethylene terephthalate), PEN (polyethylene naphthalate), and PES (polyethersulfone). After the thermal insulation film is formed on the substrate, other film layers of the flexible display element may be continued to be prepared on the thermal insulation film, so as to form a final flexible display element. Alternatively, any other kind of substrate may be selected, such that after the thermal insulation film is prepared, the thermal insulation film may be separated from the substrate and applied to the display element.

In step 102, an orthogonal projection of the sacrificial layer 10 on the substrate 1 coincides with an orthogonal projection of the plurality of hollow holes 101 on the substrate 1, as shown in FIG. 6. Therefore, the corresponding sacrificial layer 10 may be manufactured according to the number and shape of the hollow holes 101 to be formed.

In step 103, a thermal insulation film 20 covering the sacrificial layer 10 may be formed by selecting a transparent thermal insulation material or an opaque thermal insulation material according to actual needs, and then the thermal insulation film 20 is patterned to form a thermal insulation layer 202 including at least one opening 201. Exemplarily, the thermal insulation layer 202 is made of: one or more of an oxygen-containing compound, a carbon-containing compound, an oxygen- and carbon-containing compound, a nitrogen-containing compound, an oxygen- and nitrogen-containing compound, a boron-containing compound, an oxygen- and boron-containing compound, a fluorine-containing compound, an oxygen- and fluorine-containing compound, a silicon-containing compound, a silicon- and oxygen-containing compound and acrylic. Optionally, a thermal insulation layer 202 is manufactured by using silicon oxide, silicon nitride, silicon oxynitride or a photosensitive resin as the thermal insulation material.

In step 104, since at least one opening 201 capable of exposing a portion of the sacrificial layer 10 is formed on the thermal insulation layer 202, the sacrificial layer 10 under the thermal insulation layer 202 is completely removed through at least one opening 201 formed on the thermal insulation layer 202 by using an etching process, so that a plurality of hollow holes 101 are formed between the thermal insulation layer 202 and the substrate 1.

As can be seen from the specific steps of the above manufacturing method, the thermal insulation film 20 produced by the above manufacturing method includes a plurality of hollow holes 101 capable of locking some air, so that the thermal insulation film 20 is formed into a composite structure including an air layer and a dielectric layer formed of a thermal insulation material. Based on the previous analysis, such composite structure including the air layer and the dielectric layer has lower dielectric constant and thermal conductivity relative to a single dielectric layer.

Therefore, the thermal insulation film 20 manufactured by the method for manufacturing the thermal insulation film provided by the embodiment of the present disclosure may achieve lower dielectric constant and thermal conductivity, so that when the thermal insulation film 20 is applied to a display element, the thermal insulation film 20 may be formed on the substrate, and then the display element is continued to be formed on the thermal insulation film, to reduce the influence of the high temperature process on the substrate during the process of manufacturing the display device. Further, when the thermal insulation film 20 manufactured by the manufacturing method provided by the embodiment of the present disclosure is applied to the touch display device, the thermal insulation film 20 may be formed between the touch electrode layer and the display element, so as to achieve the technical effect of reducing the electrical coupling effect between the touch electrode layer and the display element. In addition, the thermal insulation film 20 applied to the touch display device may also avoid the influence of the high temperature process on the substrate in the touch display device.

In some embodiments, an orthogonal projection of the thermal insulation layer 202 on the substrate 1 is located within an orthogonal projection of the sacrificial layer 10 on the substrate 1.

Specifically, the orthogonal projection of the thermal insulation layer 202 on the substrate 1 located within the orthogonal projection of the sacrificial layer 10 on the substrate 1 means that an orthogonal projection of an outer boundary of the sacrificial layer 10 on the substrate 1 is capable of enclosing an orthogonal projection of the thermal insulation layer 202 on the substrate 1. This arrangement allow the total volume of all the hollow holes 101 formed between the thermal insulation layer 202 and the substrate 1 to be larger after the sacrificial layer 10 is removed, thereby allowing the manufactured thermal insulation film 20 to include a larger area of the air layer, and further well reducing the dielectric constant and thermal conductivity of the thermal insulation film 20.

In some embodiments, the above step 102, forming a sacrificial layer 10 on the substrate 1, may include:

step 1021, depositing a sacrificial material on the substrate 1; and step 1022, patterning the sacrificial material to obtain the sacrificial layer. The sacrificial layer 10 has a mesh structure formed by crossing a plurality of branch lines extending along a first direction and a plurality of branch lines extending along a second direction.

In step 1021, a film layer of a sacrificial material may be formed by depositing the sacrificial material on the substrate 1. It should be noted that the types of sacrificial materials selected are various, and need only be capable of being completely removed by an etching process in the subsequent removal.

In step 1022, the specific method for patterning the film layer of the sacrificial material is various. Exemplarily, patterning methods commonly used in semiconductor manufacturing processes and the display panel industry may be used, including: photolithography, 3D printing, laser direct writing, screen printing and the like.

When the sacrificial layer 10 is formed, the sacrificial material may be patterned according to actual needs, thereby obtaining the sacrificial layer 10 that meets the demand. Exemplarily, the sacrificial layer 10 may have mesh structure specifically formed by crossing a plurality of branch lines extending along a first direction and a plurality of branch lines extending along a second direction. More specifically, the plurality of branch lines extending in the first direction and the plurality of branch lines extending in the second direction are periodically arranged. Thus, after the sacrificial layer 10 is removed, the corresponding formed hollow holes 101 may be uniformly distributed periodically, so that the distribution of the air layer included in the formed thermal insulation film 20 is more uniform, thereby allowing the thermal insulation film 20 to have lower dielectric constant and thermal conductivity.

In some embodiments, in the sacrificial layer, a distance between any adjacent two laterally extending branch lines is at a sub-micron scale, and a distance between any adjacent two longitudinally extending branch lines is at a sub-micron scale; or in the sacrificial layer, a width of each branch line in a direction perpendicular to an extending direction thereof is at a sub-micron scale.

As shown in FIG. 1, the width of each branch line in a direction perpendicular to its extending direction is defined as a critical line width (CD), and the sum of the distance between any adjacent two laterally extending branch lines and the critical line width of anyone of any adjacent two laterally extending branch lines is defined as the periodic pitch (Pitch). When the sacrificial layer 10 is actually formed, both the critical line width (CD) and the periodic pitch (Pitch) may be set to be of micron and sub-micron levels, such that after the sacrificial layer 10 is removed the volume of each of the corresponding formed hollow holes 101 in the thermal insulation film 20 is relatively small, thereby better avoiding air convection and thus ensuring the formed thermal insulation film 20 to have lower dielectric constant and thermal conductivity.

In some embodiments, when the sacrificial layer 10 is manufactured, the sacrificial material selected may include one or more of aluminum, molybdenum, copper, indium tin oxide, and indium gallium tin oxide. When the sacrificial layer 10 is formed by using these materials, the step of etching the sacrificial layer 10 through the opening 201 in the above step 104 may include: etching the sacrificial layer 10 through the opening 201 by using a wet etching process, as shown in FIG. 6.

Specifically, when the thermal insulation layer 202 having the opening 201 is formed, the sacrificial layer 10 may be etched at the opening 201 of the thermal insulation layer 202 by using an etching liquid, and thus the sacrificial layer 10 may be completely removed due to the fluidity of the etching liquid.

It should be noted that the selected sacrificial material is not limited to the type listed above, as long as it is capable of being removed by a wet etching process. Optionally, metal materials or metal oxide materials commonly used in the display panel industry are selected to facilitate better cost saving.

In some embodiments, the opening 201 of the thermal insulation layer 202 may be set to be periodically distributed.

Specifically, a periodically distributed opening 201 is formed on the thermal insulation layer 202, so that when the sacrificial layer 10 is etched through the opening 201 by using the etching liquid, the etching liquid may uniformly etch the sacrificial layer, which is conducive to better forming hollow holes 101. It should be noted that the density and the size of the opening 201 formed on the thermal insulation layer 202 are not particular limited, and may be set according to the etching rate of the etching liquid used in the actual manufacturing process, and the production rhythm of production line. The setting principle is that the etching liquid may evenly etch the sacrificial layer under the set production rhythm of production line.

Figure 7:
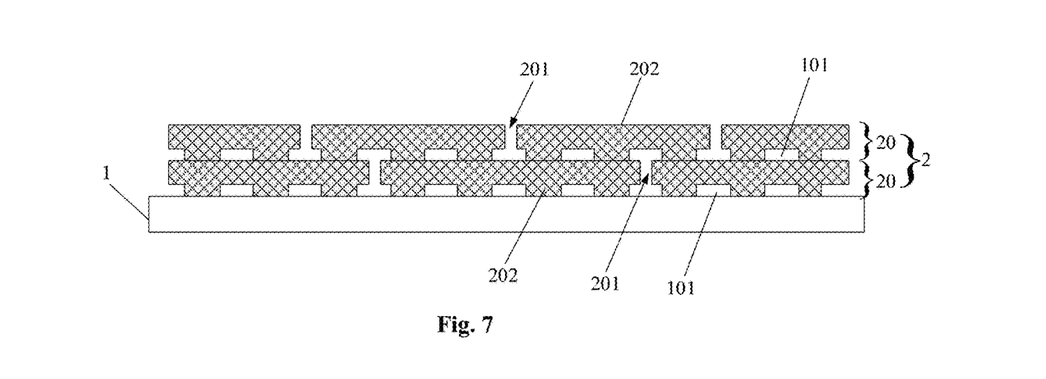
FIG. 7 is a first cross-sectional view of a thermal insulation structure according to an embodiment of the present disclosure.

The embodiment of the present disclosure further provides a thermal insulation structure 2, as shown in FIG. 6 and FIG. 7, including at least one thermal insulation film 20 laminated on the substrate 1, in which the thermal insulation film 20 is obtained by the method for manufacturing the thermal insulation film 20 provided by the above embodiment. It should be noted that the substrate 1 of the above thermal insulation structure 2 may be either a substrate baseplate or a film layer formed on the substrate baseplate.

Specifically, as can be seen from the specific manufacturing process of the manufacturing method provided by the above embodiment, the thermal insulation film 20 manufactured by the above manufacturing method includes a plurality of hollow holes 101 capable of locking some air, so that the thermal insulation film 20 is formed into a composite structure including an air layer and a dielectric layer formed of a thermal insulation material, and such composite structure including the air layer and the dielectric layer has lower dielectric constant and thermal conductivity relative to a single dielectric layer.

The thermal insulation structure 2 provided by the embodiment of the present disclosure, when including the thermal insulation film 20 is obtained by the above manufacturing method, also has lower dielectric constant and thermal conductivity. When the thermal insulation structure 2 is applied to a display element, the thermal insulation structure 2 may be formed on the substrate of the display device, and then the display element is continued to be formed on the thermal insulation film, to reduce the influence of the high temperature process on the substrate during the process of manufacturing the display device. Further, when the thermal insulation structure 2 is applied to the touch display device, the thermal insulation structure 2 may be formed between the touch electrode layer and the display element, so as to achieve the technical effect of reducing the electrical coupling effect between the touch electrode layer and the display element. In addition, the thermal insulation film 20 applied to the touch display device may also avoid the influence of the high temperature process on the substrate in the touch display device.

In some embodiments, the above thermal insulation structure 2 may include a plurality of thermal insulation films 20. When the thermal insulation structure 2 includes a plurality of thermal insulation films 20, the openings 201 between the thermal insulation films 20 and the hollow holes 101 include various distribution states.

Exemplarily, at least two thermal insulation films 20 are formed on the substrate 1, and an orthogonal projection of an opening 201 of one of two adjacent thermal insulation films 20 on the substrate 1 does not coincide with an orthogonal projection of an opening 201 of the other one of the two adjacent thermal insulation films 20 on the substrate 1, as shown in FIG. 7.

Specifically, it is disposed in the adjacent thermal insulation films 20, and the orthogonal projection of the openings 201 in one of the adjacent thermal insulation films on the substrate 1 does not coincide with the orthogonal projection of the opening 201 in the other one of the adjacent thermal insulation films on the substrate 1, to avoid forming a deeper grooves in the thermal insulation structure 2, and to better balancing the mechanical strength of the thermal insulation structure 2 when including several thermal insulation films 20.

Figure 8:
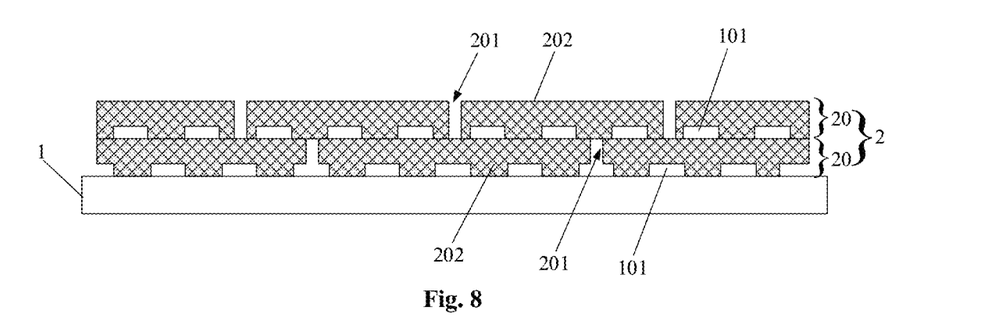
FIG. 8 is a second cross-sectional view of a thermal insulation structure according to an embodiment of the present disclosure.

Exemplarily, at least two thermal insulation films 20 are formed on the substrate 1. Exemplarily, an orthogonal projection of a hollow hole 101 in one of two adjacent thermal insulation films 20 on the substrate 1 does not coincide with an orthogonal projection of a hollow hole 101 in the other one of the two adjacent thermal insulation films 20 on the substrate 1, as shown in FIG. 8.

Specifically, it is disposed in the adjacent thermal insulation film 20, and the orthogonal projection of one of the hollow holes 101 on the substrate 1 does not coincide with the orthogonal projection of the other one of the hollow holes 101 on the substrate 1, to allow the insulation structure 2 to have better electrical uniformity and optical uniformity. It should be noted that in the manufacture of the thermal insulation structure 2, a thermal insulation structural mother board may be first manufactured on the large-sized substrate, and then the thermal insulation structural mother board is cut to obtain a plurality of thermal insulation structures 2 of any size that meet the requirements, in which the way of manufacturing the thermal insulation structure 2 may save production costs.

In some embodiments, when the thermal insulation structure 2 includes the plurality of thermal insulation films 20, the hollow holes 101 included in the plurality of thermal insulation films 20 may be uniformly distributed in the thickness direction of the thermal insulation film 20, or the upper openings 201 between the adjacent thermal insulation films 20 are staggered, and the openings 201 between the thermal insulation films 20 of the interlayers are aligned.

Figure 9:
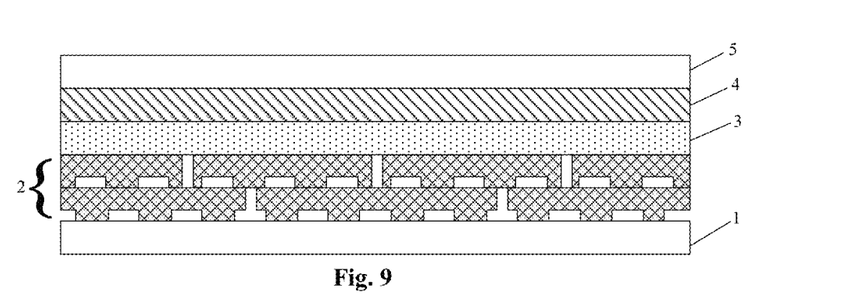
FIG. 9 is a schematic diagram of a display device according to an embodiment of the present disclosure.

An embodiment of the present disclosure further provides a display device, as shown in FIG. 9, including: a display element 4 formed on the substrate 1, and the thermal insulation structure 2 arranged between the substrate 1 and the display element 4, in which the thermal insulation structure 2 is the thermal insulation structure 2 provided by the above embodiment.

Exemplarily, the above display device includes a flexible display device. In a flexible display device, the substrate 1 used is typically a flexible substrate. Materials selected for the flexible substrate may include, but are not limited to, PC, PET, PEN, PES, and the like. It should be noted that when the flexible display device uses a plastic baseplate as the substrate, it is capable of not only achieving a better flexible display effect but also being conducive to a thin and light flexible display device.

When manufacturing the above flexible display device, the thermal insulation structure 2 is first manufactured on a flexible substrate, and then the display element 4 is manufactured on the thermal insulation structure 2 and finally aligned with the other baseplate 5 to form a complete flexible display device. Since the manufactured display element 4 is of a conventional structure and is manufactured by a conventional process, it will not be reiterated herein.

Since the thermal insulation structure 2 provided by the above embodiment has a lower thermal conductivity, the formation of the thermal insulation structure 2 between the substrate 1 and the display element 4 may generate an extremely high temperature gradient, thereby effectively suppressing the temperature rise of the substrate, and better avoiding damage to the substrate 1 when the hydrogenated amorphous silicon layer, the oxide semiconductor layer, the polysilicon layer, and the organic light emitting diode in the display element 4 are manufactured by a high temperature process.

In some embodiments, the above display device further includes an overcoat 3 arranged between the display element 4 and the thermal insulation structure 2. Specifically, when the display element 4 is manufactured, the adverse effect of the segment gap on the manufacture of the display element 4 may better avoided by forming the overcoat 3 between the display element 4 and the thermal insulation structure 2.

The overcoat 3 may be selected from various materials, e.g., one or more of an oxygen-containing compound, a carbon-containing compound, an oxygen- and carbon-containing compound, a nitrogen-containing compound, an oxygen- and nitrogen-containing compound, a boron-containing compound, an oxygen- and boron-containing compound, a fluorine-containing compound, an oxygen- and fluorine-containing compound, a silicon-containing compound, a silicon- and oxygen-containing compound and acrylic. Optionally, the overcoat 3 is manufactured by using silicon oxide, silicon nitride, silicon oxynitride, photosensitive resin or the like commonly used in the display device industry.

Figure 10:
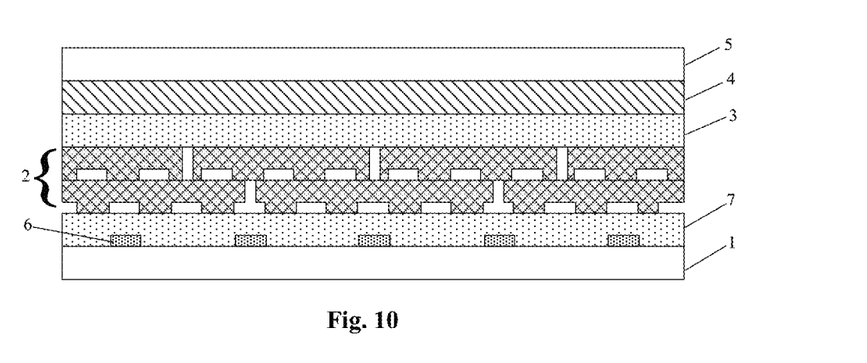
FIG. 10 is a schematic diagram of a touch display device according to an embodiment of the present disclosure.

In some embodiments, the above display device further includes: a touch electrode layer 6 between the substrate 1 and the thermal insulation structure 2, as shown in FIG. 10.

Specifically, the touch electrode layer 6 may be made of materials selected from a conductive material, e.g., a metal material (such as aluminum, molybdenum, copper, etc.) or a metal oxide material (such as indium gallium tin oxide, etc.). When the touch electrode layer 6 is formed, a conductive film may be formed on the substrate 1 by using a conductive material, and then the conductive film is patterned to form the touch electrode layer 6.

The touch electrode layer 6 is formed between the substrate 1 and the thermal insulation structure 2, such that the formed display device is formed as a touch display device of an in-cell touch structure. The touch display device of such structure integrates the touch electrode layer 6 integrated inside the display device, which not only facilitates the thinning of the display device, but also better overcomes the problem of easily scratching the screen in the touch process.

The touch electrode layer 6 is arranged between the substrate 1 and the thermal insulation structure 2, such that the thermal insulation structure 2 may serve as a dielectric layer between the touch electrode layer 6 and the display element 4. Moreover, since the thermal insulation structure 2 has low dielectric constant and thermal conductivity, the thermal insulation structure 2 may not only reduce the electrical coupling effect between the display element 4 and the touch electrode layer 6, but also avoid the damage of the high temperature process to the substrate 1 when the touch display device is prepared.

Since the process of manufacturing the above thermal insulation structure 2 includes steps of forming a sacrificial layer 10 and removing the sacrificial layer 10 by wet etching process, while the material of the sacrificial layer 10 has the same property as the material of the touch electrode layer 6, the etching liquid may also corrode the touch electrode layer 6 when the sacrificial layer 10 is etched by the etching liquid.

In order to avoid the etching liquid to etch the touch electrode layer 6 when the sacrificial layer 10 is etched, the above display device further includes: an etch stopping layer 7 arranged between the touch electrode layer 6 and the thermal insulation structure 2.

Specifically, the touch electrode layer 6 may be formed on the substrate 1, the etch stopping layer 7 is formed on the touch electrode layer 6, and then the thermal insulation structure 2 is formed on the etch stopping layer 7. Since the etch stopping layer 7 is formed on the touch electrode layer 6 and thus the touch electrode layer 6 is isolated from the subsequently formed film layer, the etching liquid will not etch the touch electrode layer 6 when the sacrificial layer 10 is etched in the process for manufacturing the thermal insulation structure 2, thereby better ensuring the production yield of the touch electrode layer 6. It should be noted that the above thermal insulation structure 2 is directly formed on the etch stopping layer 7, that is, the etch stopping layer 7 may be used as the substrate of the thermal insulation structure 2, and at least one thermal insulation film 20 may be directly formed on the etch stopping layer 7.

Exemplarily, the material used for the etch stopping layer 7 includes: one or more of an oxygen-containing compound, a carbon-containing compound, an oxygen- and carbon-containing compound, a nitrogen-containing compound, an oxygen- and nitrogen-containing compound, a boron-containing compound, an oxygen- and boron-containing compound, a fluorine-containing compound, an oxygen- and fluorine-containing compound, a silicon-containing compound, a silicon- and oxygen-containing compound and acrylic. Optionally, an etch stopping layer 7 may be formed by using a material having a low dielectric constant, such as silicon oxide, acrylic, or the like, thereby better reducing the electrical coupling effect between the display element 4 and the touch electrode layer 6.

In some embodiments, both the material of the thermal insulation film 20 included in the thermal insulation structure 2 and the material of the overcoat 3 may be set as low dielectric constant materials, thereby better reducing the electrical coupling effect between the display element 4 and the touch electrode layer 6. It should be noted that the material of the thermal insulation film 20 included in the above thermal insulation structure 2 and the material of the overcoat 3 may be selected from transparent materials or opaque materials according to actual needs.

In the technical solution provided by the present disclosure, the thermal insulation film includes a plurality of hollow holes capable of locking some air, so that the thermal insulation film is formed into a composite structure including an air layer and a thermal insulation layer, and such composite structure including the air layer and the thermal insulation layer has lower dielectric constant and thermal conductivity relative to a single thermal insulation layer. Therefore, when the thermal insulation film is applied to a display element, the thermal insulation film may be formed on the substrate, and then the display element is continued to be formed on the thermal insulation film, to reduce the influence of the high temperature process on the substrate during the process of manufacturing the display device. Further, when the thermal insulation film is applied to the touch display device, the thermal insulation film may be formed between the touch electrode layer and the display element, so as to reduce the electrical coupling effect between the touch electrode layer and the display element.

Unless otherwise defined, technical terms or scientific terms used herein have the normal meaning commonly understood by one skilled in the art in the field of the present disclosure. The words "first", "second", and the like used in the present disclosure does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, area, or substrate, is referred to as being "on" or "under" another element, the element may be directly "on" or "under" another element, or there may be an intermediate element.

In the description of the above embodiments, the specific features, structures, materials or features may be combined in any suitable manner in any one or more embodiments or examples.

The above description is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. A method for manufacturing a thermal insulation film, comprising:
    providing a substrate;
    forming a sacrificial layer on the substrate;
    forming a thermal insulation layer on the sacrificial layer, the thermal insulation layer comprising at least one opening capable of exposing a portion of the sacrificial layer; and
    etching the sacrificial layer through the opening, so as to form a plurality of hollow holes between the thermal insulation layer and the substrate,
    wherein an orthogonal projection of the thermal insulation layer on the substrate is located within an orthogonal projection of the sacrificial layer on the substrate, such that an orthogonal projection of an outer boundary of the sacrificial layer on the substrate is capable of enclosing an orthogonal projection of the thermal insulation layer on the substrate.

2. The method of claim 1, wherein
    the forming the sacrificial layer on the substrate comprises:
    depositing a sacrificial material on the substrate; and
    patterning the sacrificial material to obtain the sacrificial layer having a mesh structure formed by crossing a plurality of branch lines extending along a first direction and a plurality of branch lines extending along a second direction.

3. The method of claim 2, wherein the plurality of branch lines extending in the first direction and the plurality of branch lines extending in the second direction are periodically arranged.

4. The method of claim 2, wherein
    in the sacrificial layer, a distance between any adjacent two laterally extending branch lines is at a sub-micron scale, and a distance between any adjacent two longitudinally extending branch lines is at a sub-micron scale; or
    in the sacrificial layer, a width of each branch line in a direction perpendicular to an extending direction thereof is at a sub-micron scale.

5. The method of claim 1, wherein
    the sacrificial layer is made of one or more of aluminum, molybdenum, copper, indium tin oxide, and indium gallium tin oxide.

6. The method of claim 1, wherein the etching the sacrificial layer through the opening comprises:
    etching the sacrificial layer through the opening by a wet etching process.

7. The method of claim 1, wherein the forming the thermal insulation layer on the sacrificial layer comprises:
    forming a thermal insulation film covering the sacrificial layer with a thermal insulation material, and then patterning the thermal insulation film to form the thermal insulation layer comprising at least one opening.

8. The method of claim 1, wherein the thermal insulation layer is made of: one or more of an oxygen-containing compound, a carbon-containing compound, an oxygen- and carbon-containing compound, a nitrogen-containing compound, an oxygen- and nitrogen-containing compound, a boron-containing compound, an oxygen- and boron-containing compound, a fluorine-containing compound, an oxygenand fluorine-containing compound, a silicon-containing compound, a silicon- and oxygen-containing compound and acrylic.

9. The method of claim 1, wherein the thermal insulation layer is made of: one or more of silicon oxide, silicon nitride, silicon oxynitride and a photosensitive resin.

10. The method of claim 1, wherein
the openings of the thermal insulation layer are periodically distributed.

11. A thermal insulation structure, comprising at least one thermal insulation film laminated on a substrate, wherein the thermal insulation film comprises a thermal insulation layer and a plurality of hollow holes between the thermal insulation layer and the substrate, and the thermal insulation layer comprises at least one opening,
wherein the substrate is formed with at least two thermal insulation films, in which an orthogonal projection of an opening in one of two adjacent thermal insulation films on the substrate does not coincide with an orthogonal projection of an opening in the other one of the two adjacent thermal insulation films on the substrate.

12. The thermal insulation structure of claim 11, wherein the substrate is formed with at least two thermal insulation films, in which an orthogonal projection of a hollow hole in one of two adjacent thermal insulation films on the substrate does not coincide with an orthogonal projection of a hollow hole in the other one of the two adjacent thermal insulation films on the substrate.

13. A display device, comprising: a display element formed on a substrate, and the thermal insulation structure of claim 11 arranged between the substrate and the display element.

14. The display device of claim 13, further comprising:
an overcoat arranged between the display element and the thermal insulation structure.

15. The display device of claim 13, further comprising:
a touch electrode layer arranged between the substrate and the thermal insulation structure.

16. The display device of claim 15, further comprising:
an etch stopping layer arranged between the touch electrode layer and the thermal insulation structure.

17. A method for manufacturing a thermal insulation film, comprising:
providing a substrate;
forming a sacrificial layer on the substrate;
forming a thermal insulation layer on the sacrificial layer, the thermal insulation layer comprising at least one opening capable of exposing a portion of the sacrificial layer; and
etching the sacrificial layer through the opening, so as to form a plurality of hollow holes between the thermal insulation layer and the substrate,
wherein an orthogonal projection of the sacrificial layer on the substrate coincides with an orthogonal projection of the plurality of hollow holes on the substrate.

18. The thermal insulation structure of claim 11, wherein the plurality of hollow holes are uniformly distributed periodically.

* * * * *